United States Patent
Moisan et al.

(10) Patent No.: US 6,298,806 B1
(45) Date of Patent: Oct. 9, 2001

(54) DEVICE FOR EXCITING A GAS BY A SURFACE WAVE PLASMA

(75) Inventors: Michel Moisan, Outremont (CA); Zenon Zakrzewski, Gdansk (PL); Roxane Etemadi, Argenteuil; Jean-Christophe Rostaing, Buc, both of (FR)

(73) Assignee: L'Air Liquide, Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 0 days.

(21) Appl. No.: 09/446,980
(22) PCT Filed: Jul. 7, 1998
(86) PCT No.: PCT/FR98/01453
§ 371 Date: Feb. 29, 2000
§ 102(e) Date: Feb. 29, 2000
(87) PCT Pub. No.: WO99/04608
PCT Pub. Date: Jan. 28, 1999

(30) Foreign Application Priority Data

Jul. 16, 1997 (FR) .................................................. 97 09025

(51) Int. Cl.$^7$ .............................. C23C 16/00; H05H 1/00
(52) U.S. Cl. ..................... 118/723 MW; 118/723 ME; 118/723 MP; 156/345
(58) Field of Search ....................... 118/723 MW, 118/723 MP, 723 ME, 723 MR, 723 MA, 723 AN; 156/345; 315/111.21

(56) References Cited

U.S. PATENT DOCUMENTS

| | | | |
|---|---|---|---|
| 5,262,610 | * 11/1993 | Huang et al. | 219/121.43 |
| 5,702,530 | * 12/1997 | Shan et al. | 118/723 MP |
| 5,868,849 | * 2/1999 | Nakao | 118/723 MW |

FOREIGN PATENT DOCUMENTS 0 415 122 A2   3/1991  (EP) .
0 739 155 A1  10/1996  (EP) .

OTHER PUBLICATIONS

Patent Abstracts of Japan, JP 04041675, Publication Date Feb. 12, 1992.
J. Phys. E. Sci. Instrum. 20 (1987) 1356–1361, XP 002060541, pp. 1356–1361.

* cited by examiner

Primary Examiner—Gregory Mills
Assistant Examiner—P Hassanzadeh
(74) Attorney, Agent, or Firm—Burns, Doane, Swecker & Mathis, L.L.P.

(57) ABSTRACT

The invention concerns a device for exciting a gas comprising a hollow structure (24) forming a waveguide to be connected to a microwave generator and means for circulating a gas through the structure. The gas circulating means comprise an assembly of at least two hollow tubes (46, 48) made of dielectric material respectively passing through said structure (24) in the zones wherein the amplitude of the electric field associated with the incident wave is substantially the same.

32 Claims, 4 Drawing Sheets

DEVICE FOR EXCITING A GAS BY A SURFACE WAVE PLASMA

BACKGROUND OF THE INVENTION

1. Field of the Invention

The present invention relates to a device for exciting a gas, of the surfaguide or surfatron-guide type, in which the gas to be excited is treated with a surface-wave plasma, in particular at atmospheric pressure.

2. Description of the Related Art

In order to excite a gas, it is passed through a dielectric tube and an electric discharge, preferably out of local thermodynamic equilibrium, is sustained in this gas by means of the electric field associated with a surface wave. This wave is excited by a field applicator which is itself supplied with microwave power from a conventional waveguide.

A first type of applicator, known by the name surfatron-guide, includes a hollow structure made of electrically conductive material, including a first part which delimits a concentration zone for the incident waves and is closed off by a moving waveguide plunger forming a short-circuit, and a second part which extends perpendicularly to the first part and in which a tube made of dielectric material, through which the gas to be excited is passed, is mounted coaxially. The second part is provided with an axially movable tuning plunger for matching the impedance of the device.

Another known type of applicator, known by the name surfaguide, also includes a hollow structure which forms a waveguide, is made of an electrically conductive material, is intended to be connected to a microwave generator and is provided with a passage intended to be passed through by a dielectric hollow tube through which the excited gas is passed. The hollow structure has a longitudinal general shape and has a wave concentration zone designed to make the microwave power delivered by the generator become concentrated towards the tube during operation of the device, with a view to producing a plasma in the said gas, preferably a surface-wave plasma.

Surfaguides do not have a tuning piston such as the one which exists in the second part of surfatron guides. It is therefore less expensive than the latter. Furthermore, the length of the plasma created by surfaguides is, for equal power, slightly higher than that of the plasma created by surfatron-guides.

However, under certain operating conditions, surfaguides are less efficient than surfatron-guides, when use is made of discharge tubes of diameter in excess of 20 mm at a frequency of 2.45 GHz.

Furthermore, for high operating powers, radiation losses occur in the environment of surfaguides, which are highly prejudicial to the energy balance of the device and furthermore raise problems of reliability and safety.

In addition, because of their construction, these two types of exciter devices have relatively limited conversion yields for the gases to be treated.

Thus, for example, for $C_2F_6$, the maximum gas flow rate which it is possible to destroy to more than 90% is of the order of 500 standard cm³ per minute (SCCM). This flow rate is insufficient in a number of cases, for example for carrying out the treatment of effluent gases during the cleaning of thin-film deposition reactors for the fabrication of semiconductor devices.

Indeed, it is observed that an increase in the diameter of the tube for a given microwave power transmitted to the discharge tube, for a fixed flow rate, leads above a fairly low value to a decrease in the conversion yield. This can be explained, in particular, by the fact that an increase in the diameter of the discharge tube reduces the average energy of the electrons, which reduces the excitation by electron collisions.

Another important phenomenon connected with the diameter of the discharge tube is that of the radial contraction of discharges at atmospheric pressure, irrespective of whether they result from a DC, radio frequency or microwave electric field. This phenomenon becomes even more marked if the gas has a low thermal conductivity, as is the case with krypton.

If the contraction is significant, the plasma appears in filamentary form. As soon as there is contraction, the effect experienced by the gas as a result of the discharge becomes less and less as the distance from the axis of the tube increases.

In consequence, an increase in the diameter of the discharge tube is accompanied by the generation of one or more plasma filaments, between which the gas to be excited can flow without undergoing any excitation.

Furthermore, for a given gas flow rate, the power transmitted to the surface-wave discharge, to be increased with a view to increasing the conversion yield, cannot be increased, beyond a limit value, without risking the generation of an electric arc in the starting gap of the device.

The object of the invention is to overcome the drawbacks of the devices of surfaguide and surfatron-guide type in the prior art, and to provide a gas exciter device which makes it possible, on the one hand, to increase the gas flow rate for a given yield and, on the other hand, to increase the yield for a given gas flow rate.

SUMMARY OF THE INVENTION

The invention therefore relates to a device for exciting a gas, comprising a hollow structure, made of electrically conductive material, which forms a waveguide and is intended to be connected to a microwave generator, and means for passing the gas to be excited through the said structure, the said structure having a longitudinal general shape and including a zone for concentration of the radiation emitted by the said generator and is designed to produce a plasma in the gas during operation of the device, characterized in that the said means for passing the gas include a set of at least two identical hollow tubes made of dielectric material, respectively passing through the said structure in zones where the amplitude of the electric field associated with the incident wave is identical.

This provides an excitation device that can be equipped with a plurality of discharge tubes, through each of which a gas is passed with a relatively small flow rate, the total flow rate of the gas to be excited flowing through the device being increased considerably.

The excitation device according to the invention may furthermore include one or more of the following characteristics:

- the said concentration zone includes a set of at least two passages which are formed in the wall of the said structure with respect to a longitudinal plane of symmetry thereof and are each intended to have one of the said hollow tubes pass through them;
- the said passages are formed along the said plane of symmetry of the structure;
- the said passages are formed along two longitudinal axes extending on either side of the plane of symmetry of the structure, equidistant from this plane;

the said passages are arranged in pairs along the said plane of symmetry, the said passages in each pair being arranged symmetrically on either side of the said plane;

the said passages are formed regularly with respect to the said longitudinal plane of symmetry of the structure, the distance between two passages, considered parallel to the longitudinal direction of the said structure, being equal to an integer multiple, at least equal to 1, of the half-wavelength $\lambda_g/2$ characteristic of the waveguide at the operating frequency of the device;

the said concentration zone includes a single passage which is formed in the wall of the said structure and is intended to have the said hollow tubes pass through it;

the said hollow structure which forms a waveguide has a first open end, intended to be connected to the said microwave generator, an open opposite end, intended to be equipped with impedance adjustment means forming a short-circuit, and a zone of narrowed cross-section, in which the said passage or passages are formed, which extends between the said first and second ends and delimits the said radiation concentration zone;

the said zone of narrowed cross-section has a part with constant cross-section, in which the said passage or passages are formed and which extends between two parts with cross-section increasing linearly in the direction of the said ends;

the device furthermore includes at least one electromagnetic screening sleeve made of conductive material, secured to the said structure and extending in the continuation of the said passage or passages so as to surround the said hollow tubes;

the said at least one sleeve has a length at least equal to the length of the plasma created in the gas;

the free end of each sleeve bears a flange equipped with a hole for passage of the said hollow tubes;

the said at least one sleeve has a length equal to the sum of the length of the plasma and the wavelength of the said microwave radiation in vacuo;

the wall of the said at least one sleeve is provided with at least one orifice for viewing the plasma, the dimensions of which are designed to prevent passage of the radiation;

the diameter of the or each passage is greater than the external diameter of the said hollow tubes;

the diameter of each passage is greater than the external diameter of the said hollow tubes;

it constitutes a surface-wave exciter of the surfatron-guide type.

BRIEF DESCRIPTION OF THE FIGURES OF THE DRAWING

Other characteristics and advantages will emerge from the following description, which is given solely by way of example and made with reference to the appended drawings, in which.

DETAILED DESCRIPTION OF THE PREFERRED EMBODIMENTS

Figure 1:
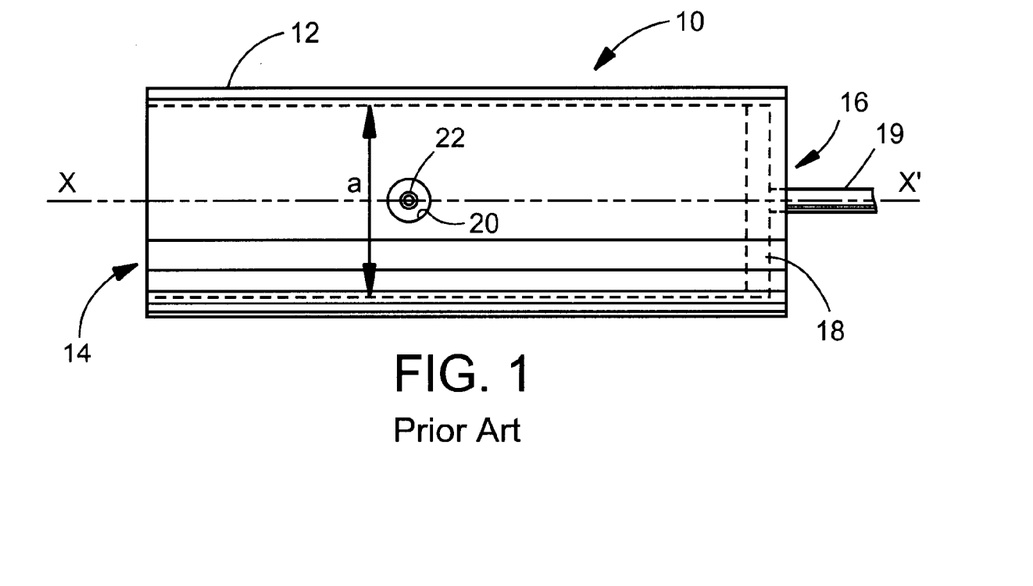
FIG. 1 is a schematic plan view of an excitation device of the prior art.

FIG. 1 represents a schematic plan view of a surfaguide of conventional type, denoted by the general numerical reference 10.

The surfaguide 10 consists principally of a hollow structure 12 which forms a waveguide, is made of an electrically conductive material and is provided with a first end 14 intended to be connected to a microwave generator (not shown), and with an opposite end 16 closed off by a moving plate 18 which forms a short-circuit and is arranged transversely with respect to the longitudinal axis X–X' of the structure 12.

The plate 18 is provided with an operating rod 19, preferably connected to drive means (not shown). It constitutes a moving short-circuit plunger which can be displaced axially with respect to the structure 12.

The hollow structure 12 is provided with a zone, for concentration of the incident microwaves, pierced with transverse orifices delimiting a passage 20 in which a hollow tube 22 made of dielectric material is placed, this tube extending perpendicularly to the axis X–X' and having a column of gas to be excited flowing through it.

During operation, the microwave radiation produced by the microwave generator is guided by the structure 12, which concentrates the incident electromagnetic energy towards the tube 22 so as to cause a travelling surface electromagnetic wave to propagate through it and through the gas mixture which it contains, the electric field associated with this wave generating and maintaining a discharge in the gas column.

Figure 2:
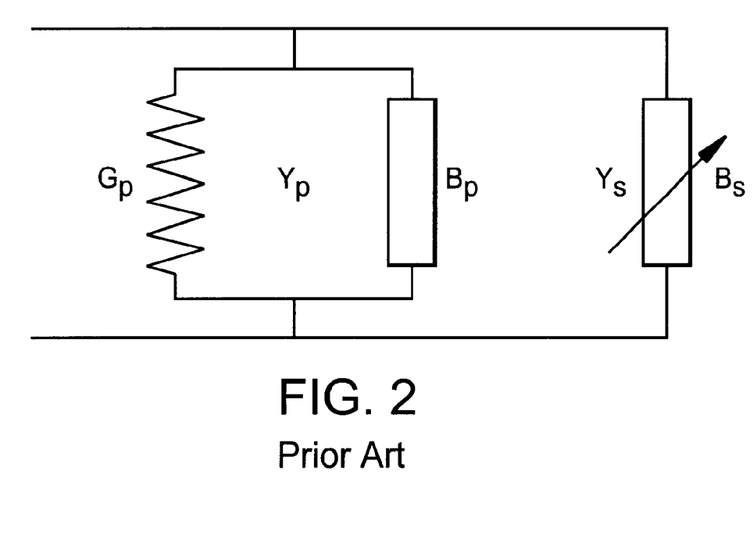
FIG. 2 represents the equivalent electrical diagram of the device in FIG. 1.

FIG. 2 represents the equivalent electrical circuit of the device in FIG. 1, in order to illustrate the power transfer phenomena taking place in this field applicator.

This figure shows that the gas exciter 12 can be represented by the combination of two admittances, $Y_p$ and $Y_s$ which are arranged in parallel and correspond respectively to the plasma generated in the gas column and to the short-circuit plunger 18.

The various elements of this circuit correspond to the processes of storing or dissipating electromagnetic energy which take place in the various parts of the device.

The admittances $Y_p$ and $Y_s$ each consist of the parallel combination of a conductance G, a term associated with the dissipation of energy, and a susceptance B, a term associated with the storage of energy, and are defined by the following equations:

$$Y_p = G_p + jB_p \quad \text{and} \tag{1}$$

$$Y_s = G_s + jB_s \tag{2}$$

In the rest of the description, the following normalized admittances will be used:

$$y_p = g_p + jb_p = Y_p/Y_0 \quad \text{and} \tag{3}$$

$$y_s = g_s + jb_s = Y_s/Y_0 \tag{4}$$

in which $Y_0$ represents the characteristic admittance of the waveguide.

It will be noted that the value of the normalized admittance $Y_p$ depends on the injected microwave power and the point in the guide where the tube 22 is located, that is to say the electric field density existing at this point.

Furthermore, the moving plunger 18 is an element which generates no energy dissipation. The conductance $g_s$ of this plunger 18 is consequently zero.

Furthermore, the susceptance $b_s$ of the plunger 18 can assume any value between minus infinity and plus infinity when the plunger is moved over one half-wavelength $\lambda_g$ characteristic of the waveguide at the relevant operating frequency of the device.

This wavelength $\lambda_g$ is given by the following equation:

$$\lambda_g = \lambda_0 \Big/ (1 - (\lambda_0/2a)^2)^{\frac{1}{2}} \tag{5}$$

in which:
$\lambda_0$ is the wavelength of the microwave radiation in vacuo, and
a is the length of the long side of the rectangular cross-section of the structure 12 (FIG. 1), this length relating to the guide section in which the orifice 20 is found.

Since the term $b_s$ can assume any value, it is possible to compensate for the susceptance $b_p$ of the plasma by adjusting the position of the plunger 18, so that the normalized admittance $y_p$ is equal to $g_p$.

This leads to a minimum value of the reflected power, i.e.:

$$P_R/P_i = |(1-g_p)/(1+g_p)|^2 \tag{6}$$

in which $P_R$ denotes the reflected power, and $P_i$ denotes the incident power.

In order for the reflected power to be close to zero, it is necessary for the value of the normalized admittance $y_p$, equal to $g_p$, to be close to 1, that is to say for the impedance of the plasma to be perfectly matched to the characteristic impedance of the guide.

It should be noted that the value $g_p$ depends on the properties of the plasma and the microwave power which is transferred to it for a given composition of the gas mixture, and also on the position and geometry of the starting gap, that is to say the thinning of the wall of the waveguide in the vicinity of the tube 22, and the diameter of the passage orifices for the hollow tube 22.

When the optimum impedance tuning is achieved, the electromagnetic wave guided by the structure 12 substantially has the structure of a standing wave whose successive maxima are $\lambda_g/2$ apart, the starting gap defined by the passage orifices for the tube being positioned on one of these maxima.

As mentioned above, this type of device, provided with a single tube, has a certain number of drawbacks, in particular because of its limited yield.

Figure 3:
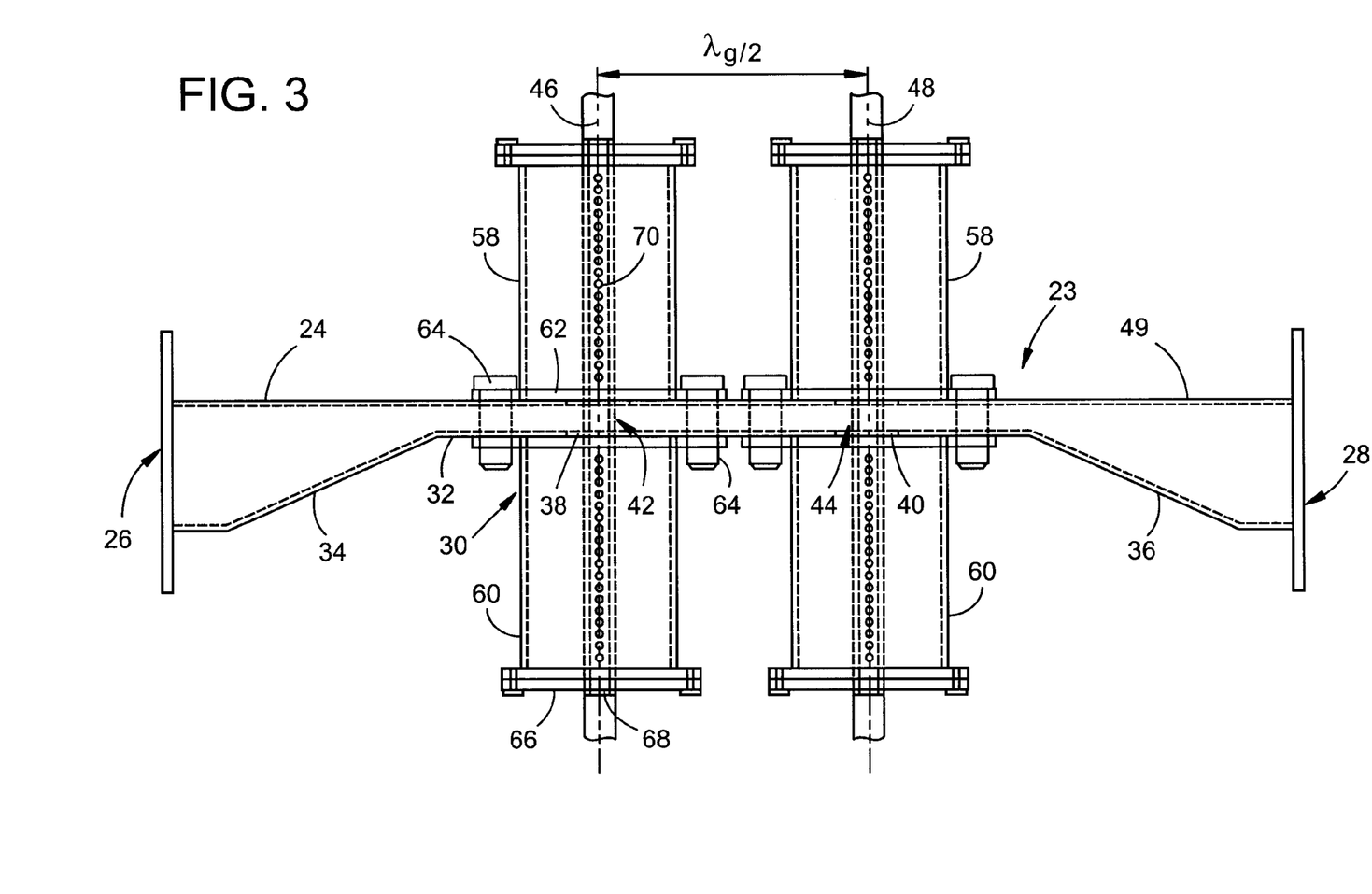
FIG. 3 is a schematic side view of the excitation device according to the invention.

FIG. 3 represents an excitation device which makes it possible to overcome this drawback.

FIG. 3 shows that the exciter, denoted by the numerical reference 23, includes a hollow structure 24 which is of longitudinal shape and is made of an electrically conductive material suitable for the use in question, in particular a metal.

The hollow structure 24 preferably has a parallelepipedal cross-section. It has a plane of symmetry which is located in the plane of FIG. 3 and is parallel to the short faces of the waveguides. It has two open ends, respectively 26 and 28, one of which is intended to be connected to a microwave generator (not shown), and the other of which is intended to be connected to means suitable for forming an adjustable short-circuit, preferably a conductive plate which is arranged transversely and can be adjusted longitudinally, as in the device represented in FIG. 1.

Between the two ends zones 26 and 28, the structure 24 includes a zone 30 of narrowed cross-section, including a central part 32 of constant cross-section which extends between two parts 34 and 36 with cross-section increasing linearly in the direction of the said end zones 26 and 28.

FIG. 3 also shows that the consecutive walls of the central part 32 are each provided with orifices, such as 38 and 40, these orifices forming passages, respectively 42 and 44, for identical tubes 46 and 48 made of dielectric material, such as silica, which are represented as being shorter than they actually are in FIG. 3 and through which a gas column to be excited flows.

The passages are arranged in zones in which the amplitude of the electric field associated with the incident wave is substantially identical during operation of the device.

According to a first illustrative embodiment, the device is equipped with two passages 42 and 44, located along the plane of symmetry of the structure 24, that is to say along a longitudinal axis consisting of the intersection of the upper large face 49 of the structure and the plane of symmetry, the said passages each being passed through by a hollow tube 46 and 48 extending generally perpendicular to the longitudinal axis.

It will be understood, however, that the device may be provided with a larger number of such passages with a view to increasing the number of tubes for exciting a gas with a higher flow rate, these passages being regularly distributed along the plane of symmetry of the structure 24.

Figure 4:
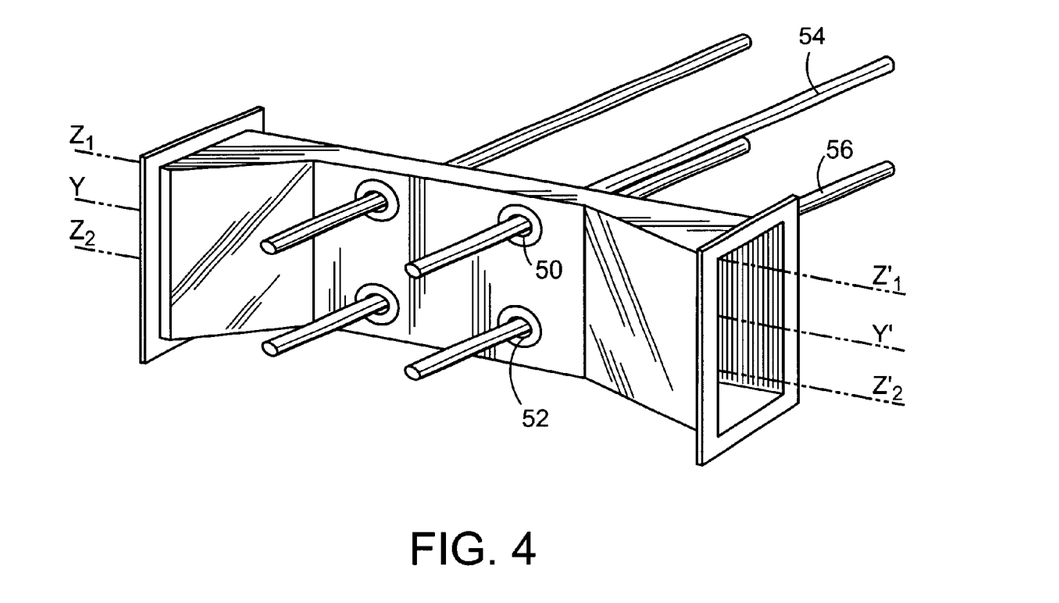
FIG. 4 is a schematic perspective view of an excitation device according to another embodiment.

As a variant, as represented in FIG. 4, it is possible to provide passages, such as 50 and 52, which are each passed through by a dielectric tube, such as 54 and 56, arranged in pairs along the plane of symmetry of the structure, that is to say along the longitudinal axis Y–Y', the passages 50 and 52 in each pair being arranged symmetrically on either side of this plane of symmetry, along two parallel axes $Z_1$–$Z'_1$, and $Z_2$–$Z'_2$.

Referring again to FIG. 3, it can be seen that the device furthermore includes, mounted on each of the large faces of the central part 32, sleeves 58 and 60 made of electrically conductive material, preferably identical to the material constituting the structure 24. The sleeves are preferably cylindrical and placed coaxially with the passages 42 and 44 formed by the orifices 38 and 40, so as to surround the tubes 46 and 48.

It will be understood that these sleeves 58 and 60 need to be made of a material with high conductivity. It is furthermore necessary for the contact of these sleeves with the structure 24 to be excellent in electrical terms. This is because, for electromagnetic waves propagating in the structure 24 at a frequency of the order of 2.45 GHz, any discontinuity in the electrical conduction would be capable of providing an outward leakage path for the radiation produced by the generator, even with very tight mechanical adjustment.

Thus, the structure 24 and the sleeves 58 and 60 are preferably made of brass so as to avoid the creation of an insulating oxide layer in the region where these pieces are fastened.

As can be seen in FIG. 3, the sleeves 58 and 60 in continuation of one another have their ends, mounted opposite one another on the waveguide, each equipped with a plate, such as 62, these plates 62 being clamped against the central part 32 with the aid of screws such as 64. This provides a very tight mechanical contact between the metal surfaces.

Furthermore, the free ends of the sleeves 58 and 60 are each equipped with a flange, such as 66, fixed on them by suitable techniques, and are provided with an orifice 68 for passage of the corresponding dielectric tube 46 and 48.

As will be mentioned below, the flanges 66 can be made of electrically conductive material, of insulating material, or may optionally be omitted depending on the length of the sleeves.

Lastly, FIG. 3 shows that the wall constituting the sleeves 58 and 60 is provided with orifices 70 making it possible to view the plasma in the gas column during operation of the device.

During operation, the waveguide 24 guides the incident microwave radiation originating from the generator towards the zone 30 of narrowed cross-section, which constitutes a concentration zone for the microwaves, and in particular towards the dielectric tubes 46 and 48.

Indeed, the zone 30 of narrowed cross-section concentrates the incident electromagnetic energy towards the central part 32 with a view to making a travelling surface electromagnetic wave propagate through the tubes and through the gas column which they contain, the electric field associated with this wave generating and maintaining a plasma in the gas column with a view, as is conventional, to exciting and ionizing the gas particles.

As before, in the case of a single tube, when the tuning is carried out by acting on the moving plunger fitted to the end 28 of the structure 24 lying opposite the end 26 which is connected to the microwave generator, the normalized admittance of the device is equal to the sum of the conductances $g_p$ of the tubes.

When the admittance is tuned to the characteristic admittance of the waveguide, optionally with the aid of an additional tuning device in order to obtain a reflected power $P_R$ that is as low as possible, for example a conventional type of three-plunger, parallel-screw adapter, the normalized admittance of the device is substantially equal to 1. A standing wave is then obtained in the structure 24 with maxima that are $\lambda_g/2$ apart.

With a view to obtaining power transfer which is sufficient and equal between the various plasmas, the passages 42 and 44 are formed in the wall constituting the structure 24 at distances equal to $\lambda_g/2$, the tuning being adjusted so as to make the location of each tube coincide with a zone in which the amplitude of the electric field associated with the incident wave in the guide is a relative maximum, that is to say in a zone in which the partial derivative of the value of the electric field along the axis X–X' is zero. In this case, the starting gaps formed by the orifices 38 and 40 are arranged in zones in which the structure of the electric field of the incident wave is identical. The power transferred to the two plasmas is therefore also identical.

It will therefore be understood that this arrangement makes it possible, for a given conversion yield, to increase considerably the gas flow rate treated.

As mentioned above, it is possible to provide the wall with a set of passages that are aligned with the principal axis of the guide and are $\lambda_g/2$ apart or, as represented in FIG. 4, in which the sleeves have been omitted for the sake of clarity, to arrange a plurality of sets of two orifices located symmetrically with respect to the plane of symmetry or the principle axis Y–Y' of the guide, each pair being $\lambda_g/2$ apart along this axis.

In this case, in which the orifices are located at a distance x from the principal axis X–X' at the waveguide, the normalized admittance of the plasma is given by the following equation:

$$g_p = g_{p0} \cdot \cos_2(\pi x/a) \qquad (7)$$

in which $g_{p0}$ is the admittance for an orifice which is located in the same longitudinal position but on the principal axis.

It is therefore also possible, according to this embodiment, to optimize the value of the normalized admittance of the device by arranging, at a suitable distance from the principal axis Y–Y', the orifices located in an off-centre position, and by acting on the impedance adjustment means.

It should be noted that, in order to provide more space for fitting these off-centre orifices, the electric field applicator is preferably made on a guide section of the WR 430 type at a frequency of 2.45 GHz.

Figure 5:
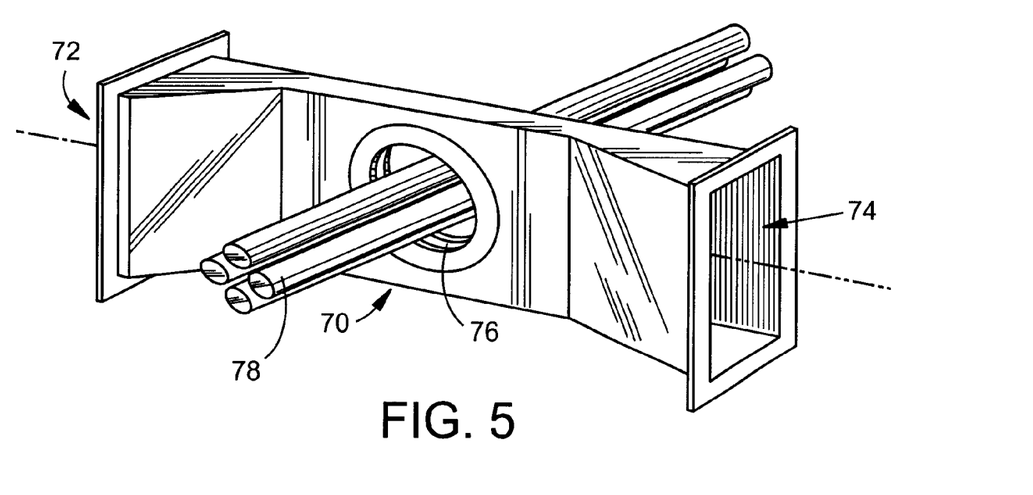
FIG. 5 represents a perspective view of an excitation device according to another embodiment.

FIG. 5 represents another embodiment of the excitation device.

As in the illustrative embodiments mentioned above, this device also includes an electrically conductive hollow structure 70 provided with two mutually opposite end zones 72 and 74, one of which is intended to be connected to a microwave generator and the other of which is intended to be equipped with a means which forms a short-circuit.

As can be seen in this figure, the structure 70 is provided with a single passage 76 in which a plurality of discharge tubes such as 78 are arranged symmetrically with respect to the axis of the passage 76, there being, for example, four of these tubes.

The passage 76 is arranged on the principal axis of the structure 70, at a location corresponding to a maximum in the electric field associated with the incident wave.

As in the case of the illustrative embodiments described above, the device furthermore includes electromagnetic screening (not shown) consisting of one or two sleeves located in continuation of one another and of similar structure to the sleeves described with reference to FIG. 3.

This embodiment has the advantage of being more compact and of making it possible to create a common coolant sleeve (not shown) conventionally surrounding the discharge tubes 78.

It should be noted that the outer wall of each tube should be located relatively close to the circular edge of the passage 76 in order to obtain satisfactory energy coupling. The diameter of the orifices constituting the passage 76, and therefore the spacing between the tubes, should be large enough to reduce the interference between the surface waves excited on each of the discharge tubes, but need to be small enough to make the tubes close in order to promote the equipartition of the power between them.

In order to increase further the gas flow rate which can be treated, it is possible to combine the two embodiments described above in the same device, that is to say by providing a plurality of passages, each of which is passed through by a plurality of discharge tubes.

It should be noted that in the various embodiments described with reference to FIGS. 3 to 5, the diameter of each of the sleeves must be chosen large enough so as not to interfere with the propagation of the surface wave which creates the discharge.

This choice is dictated by two considerations.

On the one hand, if this diameter is too small, the microwave field at the wall of the sleeve may become too great, the decrease in the associated electric field being approximately exponential from the wall of the tube or tubes. Thus, since the conductivity of the metal is not infinite, heating losses may occur in the wall constituting the sleeves, this heating being furthermore capable of causing damage to these sleeves.

The minimum diameter thus depends on the microwave power which it is desired to inject into the plasma, that is to say the operating conditions of the device.

For example, in the embodiment illustrated in FIG. 3, in which each sleeve surrounds a single tube 46, in order to limit losses the minimum diameter of the sleeve is chosen to be equal to twice that of the tubes.

Furthermore, if the diameter is too high, the structure of the electromagnetic field may lose its travelling surface wave character, and coupling of the resonant cavity type may be exhibited, which will make the discharge regime unsteady through energy exchange between the cavity modes and the surface wave mode.

It will further be noted that the length of the sleeves is chosen to be at least equal to the length of the plasma, so that it is fully contained inside the sleeves.

If the length of the sleeves is only very slightly greater than that of the plasma, the flanges 66 (FIG. 3) are preferably made of electrically conductive material, so as to prevent the radiation from escaping to the outside.

However, as mentioned above, these flanges 66 are not necessarily made of conductive material, since the intensity of the microwave field is low in this region beyond the limit of the plasma.

In particular, for a sleeve length equal to the sum of the length of the plasma and the wavelength of the radiation, the intensity of the radiation is substantially zero in the end segment of the sleeves 58 and 60. In this case, the flanges 66 may be omitted.

Furthermore, in the embodiments represented in FIGS. 3 and 4, the diameter of the orifices 38 and 40 which delimit the passages 42 and 44 for the tubes and are formed in the part constituting the central part, has a value relatively close to that of the external diameter of the tubes, for example greater than the external diameter of the tubes by 1 or 2 mm.

According to an advantageous variant, the diameter of the passages 42 and 44 is greater than the external diameter of the tubes 46 and 48. For example, for a discharge tube 46 and 48 having an external diameter approximately equal to 15 mm, the diameter of the passages is preferably chosen to be equal to 20 and 22 mm, so as to form a gap between the wall constituting the central part 32 and the tube 46 and 48.

According to this embodiment, the concentration of the microwave energy is reduced in the starting gap of the device. It is therefore possible to work out higher powers in order to obtain better efficiency of the device without risking damage to the tube.

It will be understood that the invention which has just been described above, according to the various embodiments, makes it possible to obtain multiple surface-wave plasmas with the aid of a single electric-field applicator, and therefore to increase considerably the maximum tolerable flow rate of gas to be treated for obtaining a given excitation yield, and to do this with relatively small overall size.

Furthermore, the compact and symmetrical configuration of the excitation device provides very good performance in terms of the efficiency with which the microwave power is transmitted to the plasma and the equipartition of this power between the plasmas.

Figure 6:
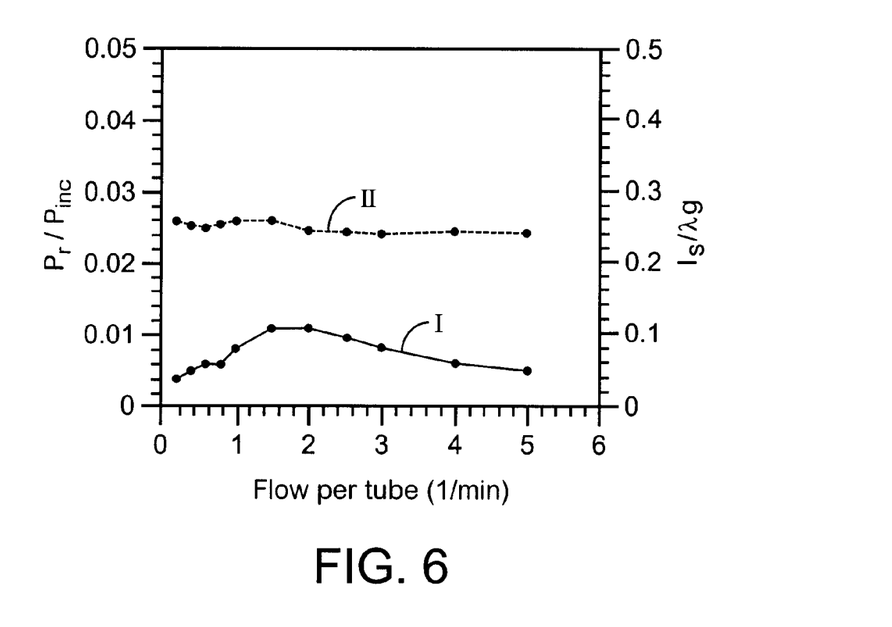
FIG. 6 shows curves of the ratio of the reflected power to the incident power, and of the effective position of the tuning plunger at minimum reflected power to the wavelength characteristic of the guide at 2.45 GHz as a function of the gas flow rate per tube, at an incident power of 500 W, for a device according to the invention.

FIG. 6 represents curves which, for the device with two tubes represented in FIG. 3, illustrate the ratio ($P_R$/Pinc) of the reflected power to the incident power (curve I), as well as the ratio of the effective position of the tuning plunger $I_s$ at the minimum in the reflected power to the wavelength $\lambda_g$ characteristic of the guide, as a function of the flow rate through the tube (curve II), with a total incident power equal to 500 W.

This curve was obtained by using pure argon as the gas to be excited. The external and internal diameters of the discharge tubes are respectively equal to 7 mm and 5 mm.

It will be understood that the reflected power remains very small and that the sensitivity of the impedance tuning conditions with respect to the studied parameters of the discharge is very small for an excitation device of this type.

In the various embodiments described with reference to FIGS. 3 and 4, the passage orifices for the discharge tubes are arranged at locations which correspond to maxima along the axis X–X' or Y–Y' of a standing wave in the guide and are $\lambda_g/2$ apart along this longitudinal axis.

However, it is possible to position the orifices in such a way as to space them apart by a distance equal to a multiple of $\lambda_g/2$, so as to occupy only some of the positions corresponding to a maximum.

Similarly, for the embodiment represented in FIG. 4, in which the passages are arranged along two axes $Z_1$–$Z_1$' and $Z_2$–$Z_2$' that are parallel and symmetrical with respect to the principal axis Y–Y' of the structure, it is possible to distribute these passages arbitrarily to the nodes of a network formed by the two longitudinal axes $Z_1$–$Z_1$' and $Z_2$–$Z_2$' and by a series of transverse axes that are $\lambda_g/2$ apart.

Although these variants involve an increased overall size, they are advantageous in the case when tubes and/or sleeves of large diameter are used.

Furthermore, although the excitation device illustrated in FIGS. 2 to 4 has tubes extending perpendicularly to the principal axis of the structure, it is possible, depending on the environment of the device, to position these tubes so that they are very slightly inclined with respect to this axis, for retaining a symmetrical configuration.

Furthermore, in the embodiments described above, the exciter device constitutes an applicator of the surfaguide type.

However, a device of this type may use an applicator of the surfatron-guide type as its basic structure. It will be understood, in particular, that the embodiment described in FIG. 5, which has lower overall tube size, is in particular suited to the construction of a surfatron-guide, because of the large diameter of the passage orifice.

It will lastly be noted that the exciters described with reference to FIGS. 3 to 5 can be used to produce combinations of plasma reactors either in parallel or in series, by feeding the output of one tube back to the input of another tube excited by the same applicator.

What is claimed is:

1. Device for exciting a gas, comprising a hollow structure, made of electrically conductive material, which forms a waveguide and is intended to be connected to a microwave generator, and means for passing the gas to be excited through said structure, said structure having a longitudinal general shape and including a zone of narrowed cross section which is intended for concentration of the radiation emitted by said generator and is designed to produce a plasma in the gas during operation of the device, wherein said means for passing the gas include a set of at least two identical hollow tubes made of dielectric material, respectively passing through said structure in zones where the amplitude of the electric field associated with the incident wave is a maximum.

2. A device according to claim 1, wherein said concentration zone includes a set of at least two passages which are formed in the wall of said structure with respect to a longitudinal plane of symmetry thereof and are each intended to have one of said hollow tubes pass through them.

3. Device according to claim 2, wherein said passages are formed along said plane of symmetry of the structure.

4. Device according to claim 3, wherein said hollow structure which forms a waveguide has a first open end, intended to be connected to said microwave generator, an open opposite second end, intended to be equipped with impedance adjustment means forming a short-circuit, wherein said zone of narrowed cross-section, in which said passage or passages are formed, extends between said first and second ends and delimits said radiation concentration zone.

5. Device according to claim 4, wherein said zone of narrowed cross-section has a part with constant cross-section, in which said passage or passages are formed and which extends between two parts with cross-section increasing linearly in the direction of said ends.

6. Device according to claim 3, wherein it furthermore includes at least one electromagnetic screening sleeve made of conductive material, secured to said structure and extending in continuation of said passage or passages so as to surround said hollow tubes.

7. Device according to claim 6, wherein said at least one sleeve has a length at least equal to the length of the plasma created in the gas.

8. Device according to claim 3, wherein the diameter of each passage is greater than the external diameter of said hollow tubes.

9. Device according to claim 2, wherein said passages are formed on either side of the plane of symmetry of the hollow structure, equidistant from said plane of symmetry.

10. Device according to claim 2, wherein said passages are formed along two longitudinal axes extending on either side of the plane of symmetry of the structure, equidistant from this plane.

11. Device according to claim 10, wherein said passages are formed in pairs along said plane of symmetry, said passages in each pair being formed symmetrically on either side of said plane.

12. Device according to claim 2, wherein said hollow structure which forms a waveguide has a first open end, intended to be connected to said microwave generator, an open opposite second end, intended to be equipped with impedance adjustment means forming a short-circuit, wherein said zone of narrowed cross-section, in which said passage or passages are formed, extends between said first and second ends and delimits said radiation concentration zone.

13. Device according to claim 12, wherein said zone of narrowed cross-section has a part with constant cross-section, in which said passage or passages are formed and which extends between two parts with cross-section increasing linearly in the direction of said ends.

14. Device according to claim 2, wherein it furthermore includes at least one electromagnetic screening sleeve made of conductive material, secured to said structure and extending in continuation of said passage or passages so as to surround said hollow tubes.

15. Device according to claim 14, wherein said at least one sleeve has a length at least equal to the length of the plasma created in the gas.

16. Device according to claim 15, wherein the free end of each sleeve bears a flange equipped with a hole for passage of said hollow tubes.

17. Device according to claim 15, wherein said at least one sleeve has a length equal to the sum of the length of the plasma and the wavelength of said microwave radiation in vacuo.

18. Device according to claim 15, wherein the wall of said at least one sleeve is provided with at least one orifice for viewing the plasma, the dimensions of which are designed to prevent passage of the radiation.

19. Device according to claim 14, wherein the free end of each sleeve bears a flange equipped with a hole for passage of said hollow tubes.

20. Device according to claim 19, wherein said at least one sleeve has a length equal to the sum of the length of the plasma and the wavelength of said microwave radiation in vacuo.

21. Device according to claim 19, wherein the wall of said at least one sleeve is provided with at least one orifice for viewing the plasma, the dimensions of which are designed to prevent passage of the radiation.

22. Device according to claim 14, wherein said at least one sleeve has a length equal to the sum of the length of the plasma and the wavelength of said microwave radiation in vacuo.

23. Device according to claim 14, wherein the wall of said at least one sleeve is provided with at least one orifice for viewing the plasma, the dimensions of which are designed to prevent passage of the radiation.

24. Device according to claim 2, wherein the diameter of each passage is greater than the external diameter of said hollow tubes.

25. Device according to claim 2, wherein said passages are formed regularly with respect to said longitudinal plane of symmetry of the structure, the distance between two passages, considered parallel to the longitudinal direction of said structure, being equal to an integer multiple, at least equal to 1, of the half-wavelength $\lambda_g/2$ characteristic of the waveguide at the operating frequency of the device.

26. Device according to claim 2, wherein it constitutes a surface-wave exciter of the surfaguide type.

27. Device according to claim 2, wherein it constitutes a surface-wave exciter of the surfatron-guide type.

28. Device according to claim 1, wherein said passages are formed regularly with respect to said longitudinal plane of symmetry of the structure, the distance between two passages, considered parallel to the longitudinal direction of said structure, being equal to an integer multiple, at least equal to 1, of the half-wavelength $\lambda_g/2$ characteristic of the waveguide at the operating frequency of the device.

29. Device according to claim 1, wherein said concentration zone includes a single passage which is formed in the wall of said structure and is intended to have said hollow tubes pass through it.

30. Device according to claim 1, wherein it constitutes a surface-wave exciter of the surfaguide type.

31. Device according to claim 1, wherein it constitutes a surface-wave exciter of the surfatron-guide type.

32. System for treating an effluent gas from a semiconductor fabrication reactor, comprising downstream from said reactor, the device for exciting a gas according to claim 1.

* * * * *